United States Patent [19]

Brockman

[11] 4,295,140
[45] Oct. 13, 1981

[54] FARADAY ROTATION MEASUREMENT METHOD AND APPARATUS

[76] Inventor: Robert A. Frosch, Administrator of the National Aeronautics and Space Administration, with respect to an invention of Milton H. Brockman, Glendale, Calif.

[21] Appl. No.: 106,119

[22] Filed: Dec. 21, 1979

[51] Int. Cl.³ ............................................. H04B 7/00
[52] U.S. Cl. ............................... 343/100 PE; 455/60; 455/137; 455/139
[58] Field of Search ................... 343/100 PE; 455/60, 455/137, 139

[56] References Cited

U.S. PATENT DOCUMENTS

| | | |
|---|---|---|
| 3,646,448 | 2/1972 | Harmon, Jr. et al. ................ 455/60 |
| 4,112,370 | 9/1978 | Monsen ........................ 343/100 PE |
| 4,186,347 | 1/1980 | Frosch et al. ....................... 455/316 |
| 4,220,923 | 9/1980 | Pelchat et al. ....................... 455/63 |

*Primary Examiner*—S. C. Buczinski
*Attorney, Agent, or Firm*—Monte F. Mott; John R. Manning; Paul F. McCaul

[57] ABSTRACT

A method and apparatus for measuring Faraday rotation of a received rf signal. The disclosure describes a specific implementation of a simultaneous orthogonal polarization receiver which compensates for a 3 db loss due to splitting of a received signal into left circular and right circular polarization channels. The compensation is achieved by rf and modulation arraying utilizing a specific receiver array which also detects and measures Faraday rotation in the presence or absence of spin stabilization effects on a linear polarization vector. Either up-link or down-link measurement of Faraday rotation is possible utilizing the method and apparatus disclosed herein. Specifically, the Faraday measurement apparatus utilized in conjunction with the specific receiver array provides a means for comparing the phase of a reference signal in the receiver array to the phase of a tracking loop signal related to the incoming signal, and comparing the phase of the reference signal to the phase of the tracking signal shifted in phase by 90 degrees. One of the comparison signals is averaged so that its output represents an average phase change of the received signal, whereas the other comparison signal is not averaged, this signal thus being related to the instantaneous phase change which includes a component due to spin stabilization of the spacecraft and a component due to Faraday rotation as the transmitted signal passes through a medium prior to arriving at the receiver. These two signals, i.e., the averaged and unaveraged signals, are compared, the phase changes between the two signals being related to Faraday rotation.

15 Claims, 4 Drawing Figures

FARADAY ROTATION MEASUREMENT METHOD AND APPARATUS

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435, 42 USC 2457).

TECHNICAL FIELD

The invention relates to Faraday measurement methods and apparatus to be utilized in conjunction with an rf receiving system.

BACKGROUND ART

Faraday rotation, that is, the rotation of an electric vector of a transmitted rf signal due to passing through a medium, provides an indication of the characteristics of the medium through which the transmitted signal passes prior to reaching the receiver. Thus, trained interpreters can utilize Faraday rotation information to help determine characteristics of an unknown medium through which the transmitted signal passes. Interpretation of Faraday rotation information is especially useful in spacecraft scientific experiments when transmitted signals frequently pass through gaseous materals having unknown characteristics. In addition, these types of scientific spacecraft are frequently spin stabilized, and result in a polarization rotation of the transmitted signal unrelated to charged particles/magnetic field phenomena of a medium through which the signal passes. In such systems, there is a need to extract Faraday rotation from the polarization rotation due to spacecraft spin stabilization. The apparatus and method provided by the present invention satisfies this need.

STATEMENT OF THE INVENTION

In an rf receiver array having at least a first and a second receiving system, the first receiving system having a reference signal for forming an IF signal and the second receiving system having a tracking loop feedback signal whose phase is related to the phase of a received signal, the invention provides a measurement means for determining Faraday rotation of the received signal which includes a first phase detector, a second phase detector, a means for providing the reference signal to the first phase detector, a means for providing the reference signal phase-shifted by a predetermined increment to the second phase detector, a means for providing the tracking loop feedback signal to both the first and second phase detectors, a means for averaging the output of one of the phase detectors so as to provide an averaged signal related to the average rotation rate of an incoming polarization vector of the received signal, and a means for comparing the phase of the averaged signal and the phase of the other phase detector output signal. The phase differences between these two signals are related to the Faraday rotation of the received signal.

In an exemplary embodiment of the invention, a two channel receiving system is provided to receive left circular polarization and right circular polarization signals which constitute a spinning linearly polarized signal from a spacecraft. A signal antenna having an orthomode transducer at the end of the feed provides an input to the left circular polarization and right circular polarization receiving system channels. The receivers are arrayed as described in U.S. patent application Ser. No. 956,160 now U.S. Pat. No. 4,186,347 so that spectrum and carrier are both summed, the summed signals being applied to separate IF amplifiers for subcarrier demodulation and coherent carrier tracking and telemetry. To derive the direction of Faraday rotation on the received signal as well as the magnitude of any phase changes, orthogonal channels each employing a phase detector and a low pass filter in combination with digital processing circuits are used to replicate the transmitted rotating vector and extract the Faraday rotation complement. Since spacecraft are frequently spin stabilized at three revolutions per minute, this vector will rotate at three revolutions per minute. Superimposed on this spin rate is the Faraday rotation which could be in either direction. The Faraday rotation is separated from the stabilization rotation by zero-crossing detectors which receive an IF and quadrature IF signal and produce 90 degree displaced pulses whenever the modulation signal phase crosses zero. This differentiated modulation signal from the reference channel is averaged using a flywheel oscillator whose differentiated output turns off a Schmitt trigger. The differentiated modulation signal from the quadrature channel turns on the Schmitt trigger. The duration of the Schmitt trigger output is thus related to the difference between the average rotation rate and the sum of the rotation rate plus Faraday rotation, thereby providing a pulse width proportional to Faraday rotation. This pulse width is quantized by a standard frequency counter and displayed for subsequent interpretation.

BEST MODE FOR CARRYING OUT THE INVENTION

As required, a detailed illustrative embodiment of the invention disclosed herein exemplifies the invention and is currently considered to be the best embodiment for such purposes. It is provided by way of illustration and not limitation of the invention. Various modifications thereof will occur to those skilled in the art, and such modifications are within the scope of the claims which define the present invention.

As previously explained, a means is disclosed for detecting and measuring Faraday rotation of a received rf signal from a spacecraft in conjunction with an orthoganal polarization receiver adapted to split a received signal into left-circular and right-circular polarization channels. The receivers are arrayed as described in U.S. patent application Ser. No. 956,160. To derive the direction of Faraday rotation on the received signal, as well as the magnitude of the associated phase changes, the measurement means disclosed utilizes two orthogonal channels, each of which employs a phase detector and a low pass filter in combination with a digital signal processing circuit. The measurement means replicates the transmitted rotating vector, and extracts the Faraday rotation complement therefrom. In a specific application, the vector normally rotates at three revolutions per minute due to spin stabilization at that rate of a transmitting spacecraft. Superimposed on this vector is the Faraday rotation which can be in either direction. The Faraday rotation is separated from the rotation due to spin stabilization by use of first and second phase detectors one of which receives a first reference signal at an IF frequency and one of which receives a quadrature or second reference signal which is displaced by 90 degrees in phase with respect to the first reference signal. The first and second phase detector output signals are connected through corresponding low pass filters to first and second zero-crossing detectors which are chosen to produce output pulses whenever an incoming signal crosses zero. Thus, the output of each of the two zero-crossing detectors comprise a series of pulses, the two pulse series being nominally displaced from each other by 90 degrees. The output pulses from one of the zero-crossing detectors are averaged by an integrator such as a flywheel oscillator. In the exemplary embodiment, the output of the zero-crossing detector receiving the output of the first phase detector is averaged, and its output utilized to turn on a Schmitt trigger. The output from the other zero-crossing detector is utilized to turn off the Schmitt trigger. The duration of the Schmitt trigger output signal is then related to the difference between the average rotation rate and the sum of the actual rotation rate thus Faraday rotation. This is quantized by counting standard frequency pulses for the duration of the Schmitt trigger output pulses.

Figure 1A:
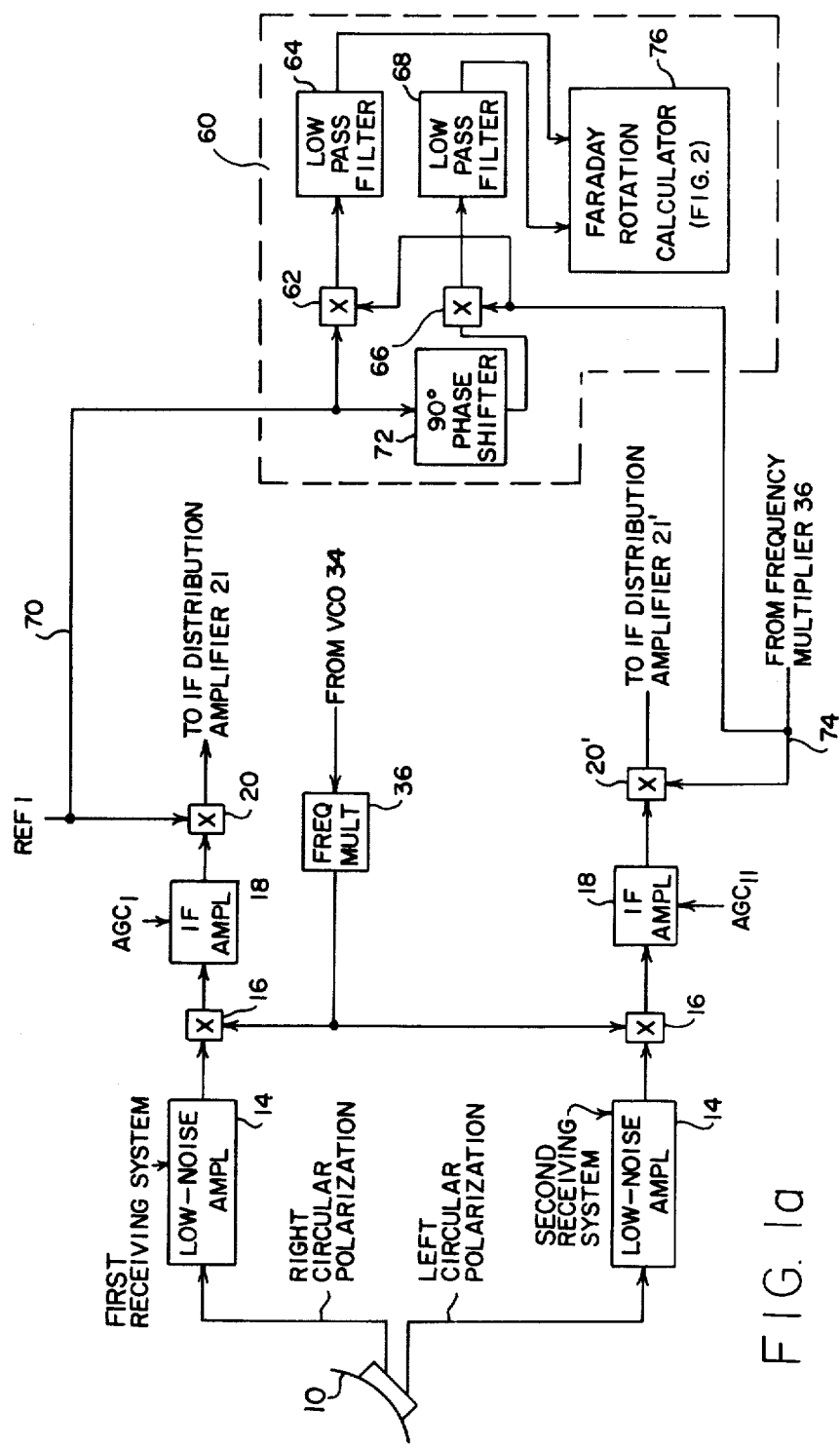
FIGS. 1A and 1B are block diagrams of a two-channel receiver array configured to receive left circular polarization and right circular polarization signals and showing the Faraday rotation measurement means provided by the invention.
Figure 1B:
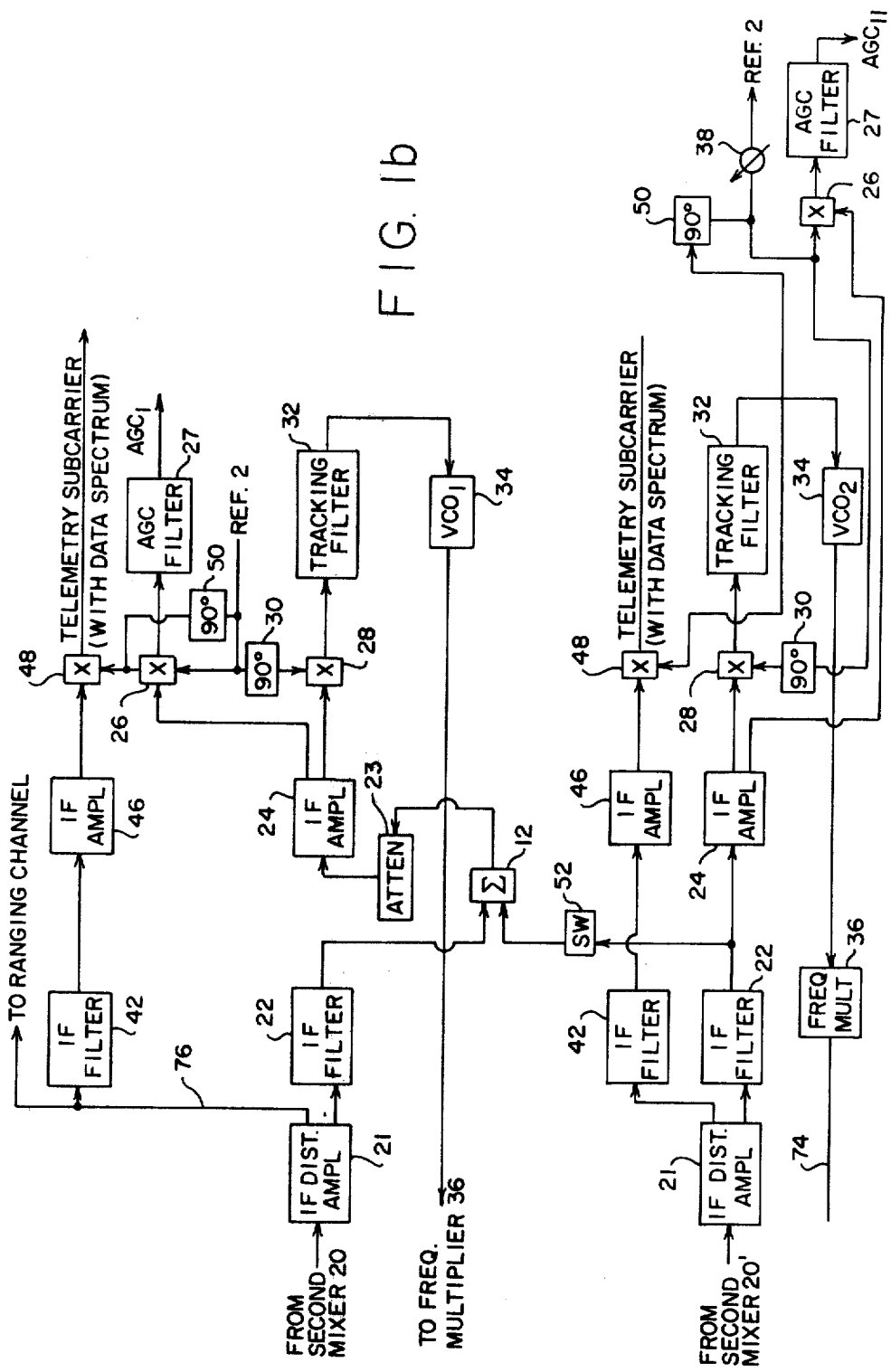

In order to understand the Faraday measurement device provided by the invention, it is necessary to describe a simultaneous orthogonal polarization receiver array adapted to compensate for a 3 db loss due to splitting a received signal into left-circular and right-circular polarization channels. Referring now to FIG. 1, a single antenna 10 having an orthomode transducer at the end of its feed provides an input signal to right-circular polarization and left-circular polarization channels. The right-circular polarization channel is provided to a first receiving system and the left-circular polarization channel is provided to a second receiving system. The receivers are arrayed as described in U.S. Pat. No. 4,186,341, one configuration of which is shown in FIG. 1 and will be described herein. It should be noted that when two receiving systems are arrayed as shown and connected to antenna 10 designed for receiving right-circular and left-circular polarized transmission simultaneously, a summed IF effectively provides the same signal-to-noise ratio for a linearly polarized signal transmission at any unknown polarization angle than that which would result from matched polarization (of the received transmission and antenna). Again, as previously explained, since the spacecraft is spin-stabilized at a constant rate, which for example could be three revolutions per minute, the polarization shift of the received signal at the antenna 10 due to Faraday rotation must be extracted from the polarization rotation due to the spacecraft spin stabilization. As will be explained below, the Faraday measurement means provided by the invention, in conjunction with the type of receiving antenna illustrated in FIG. 1, is able to isolate the two polarization rotations and identify that which is due to Faraday rotation.

Referring again to FIG. 1, the components common to the first and second receiving systems will be designated by the same reference numerals in each system. This is for ease in understanding operation of the system. To avoid confusion as to which particular element is being referred to, the text will indicate whether it is the first receiving system (No. 1) or the second receiving system (No. 2). Considering the first receiving system, and assume for a moment that the input to a summing junction 12 (a signal combining device) from the second receiving system is removed and replaced with a passive termination which matches the source impedance provided by the second receiving system. The first receiving system contains a second order rf carrier tracking loop which coherently tracks the phase of its received radio frequency carrier which contains the right circular polarization signal previously described. The loop, which follows a low-noise amplifier 14, such as a maser, includes a first heterodyne mixer 16 which reduces the received carrier signal to an intermediate frequency (IF), a first IF amplifier 18, a second heterodyne mixer 20 which mixes a first reference signal (REF 1) and the IF signal to obtain a new IF bandwidth signal, a second IF distribution amplifier 21, a second IF filter 22, an attenuator 23 for providing a means for setting the signal level at the output of the second IF distribution amplifier 21 to provide a required output level for the telemetry subcarrier in the first receiving system as will be explained below, and a second IF amplifier 24. The second IF amplifier 24 has two outputs, one being a linear output to a coherent amplitude detector 26 which mixes with a second reference signal (REF 2) directly to provide for automatic gain control (AGC) to the first IF amplifier 18 via an AGC filter 27. The other output is provided to a phase detector 28 which mixes with REF. 2 in quadrature through a 90 degree phase shifter 30 to provide, through a tracking filter 32, phase voltage control of a voltage controlled oscillator (VCO) 34. The oscillator 34 is operated at a lower frequency than required to mix with the carrier input signal. Thus it is increased in frequency by an appropriate factor by a frequency multiplier 36.

The output of the rf carrier tracking loop in the first receiving system is also provided to the second receiving system so as to phase track its received carrier, which of course is the same as that of the first receiving system. However, since the first and second receiving systems have separate low noise amplifiers 14, and could have separate antennas, there is a differential phase effect which must be tracked out. The carrier tracking loop in the second receiving system operating on the intermediate frequency (IF) takes care of tracking out of any differential phase effects with the tracking loop of the second receiving system. This tracking loop is also a second order loop that operates with a closed loop noise bandwidth which is a small fraction (about 0.01) of the carrier tracking loop in the first receiving system. The difference between the first and second receiving systems, and any other receiving systems which might be added, is that a tracking loop for the first receiving system serves all of the other receiving systems for phase tracking at the carrier frequency, and the tracking loop for the second receiving system serves only the second receiving system for tracking differential phase effects at the intermediate frequency. There is another minor difference in the second receiving system which is the addition of an adjustable phase shifter 38 applied to the coherent amplitude detector 26 for AGC control, and through the 90 degree phase shifter 30 to the phase detector 28 for phase tracking the IF signal.

Consider now FIG. 1 with the input at IF from the second receiving system reconnected to the summing junction 12 and the IF tracking loop properly phased relative to the first receiving system. Signal-to-noise ratio improvement is now realized in the carrier tracking loop of the first receiving system and consequently in the second receiving system also. Proper phasing of the second receiving system is obtained with both receivers on manual gain and with adjustment of the phase shifter 38 for maximum output from the coherent amplitude detector 26 which provides the input voltage to the ACG filter 27 in the first receiving system. Each receiver generates and operates its own automatic gain control.

The IF distribution amplifier 21 in each receiving system is chosen to have a gain sufficient to feed both the second IF filter 22 and another second IF filter 42, the additional second IF filter 42 being chosen to have a sufficiently wide passband to pass telemetry sidebands. The second IF filter 22 is chosen to have a narrow passband relative to the telemetry sidebands, and consequently filters the sidebands out. It should be noted that since gain from the second IF filter 22 to the coherent amplitude detector 26 is constant, minus the summing junction 12 loss, the attenuator 23 at the input to the second IF amplifier 24 in the first receiving system provides a means for setting the signal level at the output of the IF distribution amplifier 21 in the first receiving system to provide the required output level for the telemetry subcarrier spectrum in the first receiving system when rf carrier arraying with the second receiving system.

The IF distribution amplifier 21 on the second receiving system provides its output to the additional second IF filter 22 and the second IF filter 42. The second IF filter 22 in the second receiving system is chosen to have the same noise bandwidth as the second IF filter 22 in the first receiving system. The output of the second IF filter 22 in the second receiving system is provided as an input to the summing junction 12 as well as to the rf carrier loop and AGC in the second system. Note that the phase shift from the output of the second IF filter 22 to the phase detector 28, which provides the error signal to the tracking filter 32, is a constant by design. Consequently, the adjustable phase shifter 38 provides a means for setting the rf phase of the output of the second IF filter 22 equal to the rf phase of the output of the corresponding IF filter in the first receiving system at the summing junction 12. The second IF amplifier 24 gain is chosen so that the signal level can be set as required relative to the signal level in the first receiving system at the input to the summing junction 12.

It should be noted in this exemplary application of the arrayed receiving system described above to high-rate telemetry reception, that the point of signal-to-noise ratio improvement is in the output of the summing junction 12 which contributes to the carrier tracking loop of the first receiving system to which the second receiving system is a slave by virtue of the second receiving system receiving its first local oscillator signal from the frequency multiplier of the first receiving system. The tracking filter 32 output of the second receiving system is then used to track out any phase differences in the second receiving system through adjustment of the phase shifter 38 for the second reference (REF 2) signal. A useful output from the total system may thus be taken from the output of the summing junction 12, but in this high-rate telemetry reception application, a useful output is taken from the additional second IF filter 42 through an amplifier 46 and a telemetry channel phase detector (mixer) 48 which receives the same reference signal (REF 2) as the phase detector 28, but through a separate 90 degree phase shifter 50. The telemetry channel phase detector 48 of each receiving system provides substantially the same telemetry subcarrier (with data) spectrum that may be separately processed, or preferably combined through a baseband signal combiner. In addition, a switch 52 is provided so that the second receiving system can be decoupled from the tracking loop of the first receiving system during initial acquisition.

A Faraday rotation measurement circuit 60 shown in FIG. 1 includes a first phase detector 62 and a first low pass filter 64, the combination providing one channel of an orthogonal detector. A second phase detector 66 and second low pass filter 68 provide another channel. The first reference signal (REF 1) provided to the first receiving system on reference line 70 is provided as one input to the phase detector 62. The first reference signal is also shifted in phase by a 90 degree phase shifter 72, the shifted signal being provided as one input to the second phase detector 66. A carrier tracking feedback signal in the second receiving system appears on a feedback line 74 and is also provided as inputs to both the first and second phase detectors 62 and 66, respectively. The outputs from the first and second low pass filters 64 and 68 are provided to a Faraday rotation calculator 76 to be explained below. In the absence of any Faraday rotation effects, these two outputs would be in a precise quadrature relationship with respect to each other.

Figure 2:
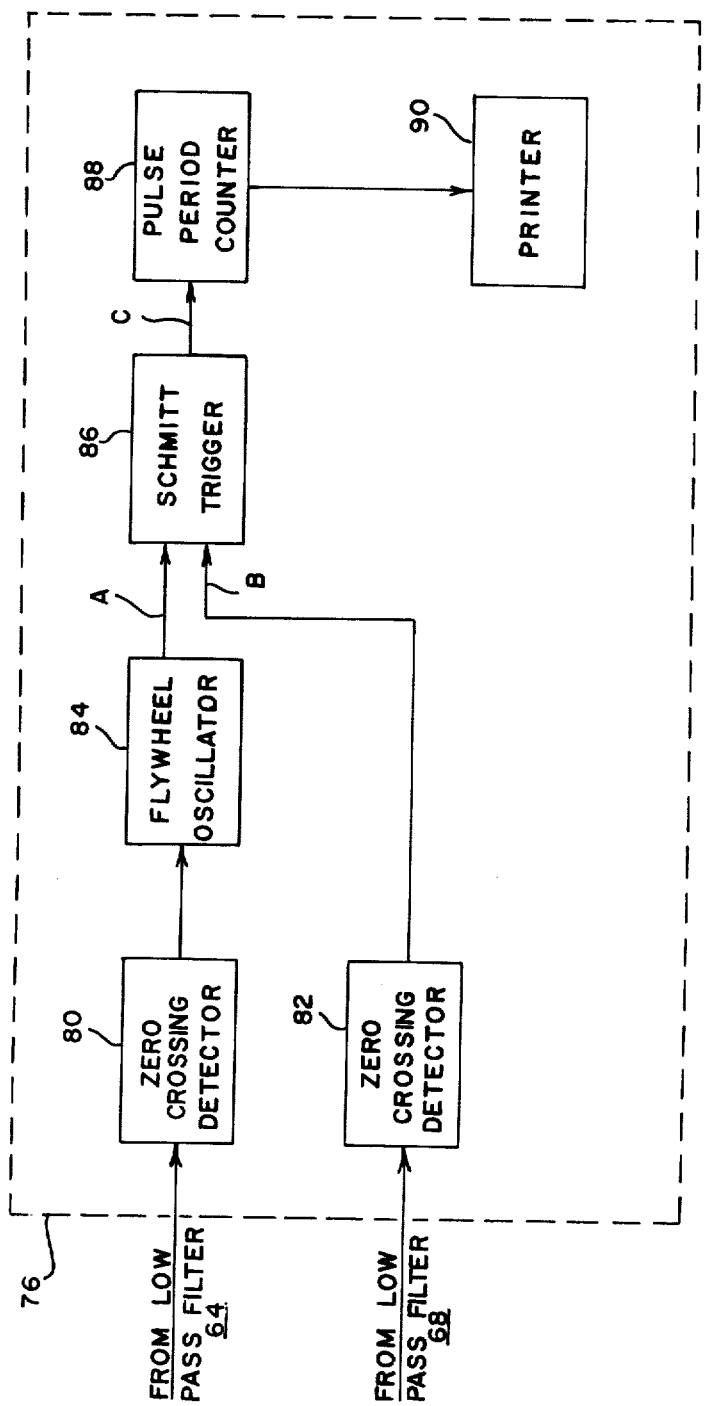
FIG. 2 is a block diagram of an embodiment of the Faraday rotation measurement means provided by the invention.

Referring now to FIG. 2, the Faraday rotation calculator 76 is shown. The first or reference channel from the first low pass filter 64 is provided to a first zero crossing detector 80 which generates an output pulse for each zero output from the first phase detector 62, these outputs occuring whenever the phase relationship between the input signals to the phase detector 62 is either zero or 180 degrees. The output pulses or occurrence time signals from the first zero-crossing detector have a positive polarity when a raising output from the low pass filter 64 crosses zero, and a pulse having a negative polarity when a falling output from the low pass filter 64 crosses zero. As previously explained, these pulses define the spin rate of a spin stabilized spacecraft, each pulse corresponding to a 180 degree rotation of the spacecraft. In a similar manner, the output of the second low pass filter 68 is provided to a second zero-crossing detector 82 which then generates a plurality of output pulses or occurrence time signals which are in a quadrature relationships to the output pulses of the first zero crossing detector. The effect of these detectors 80 and 82 is to differentiate the sinusoidal filter output signals and provide pulses of the corresponding polarity at the sine wave zero crossings. The pulses of one polarity from the first zero crossing detector 80 are used to synchronize a flywheel oscillator 84 which could be a blocking oscillator or multivibrator, the oscillator 84 being chosen so that its output pulses define an average pulse interval of the incoming pulses from the first zero-crossing detector 80. These output pulses are referred to as cyclically occurring comparison signals, and are related to the rotation rate of the spacecraft. The output pulses of the second zero-crossing detector 82 define intervals which are also related to the rotation rate of the spacecraft, but also have superimposed on the instantaneous deviations induced by Faraday rotation effects as the transmitted signal passes through an intermediate medium. A Schmitt trigger 86, whose operation will be described in detail below, provides an output pulse having a pulse width related to the phase difference between the output pulses from the second zero crossing detector 82 and the output pulses from the flywheel oscillator 84. This pulse width is thus related to Faraday rotation because each interpulse interval defined by the second zero-crossing detector 82 output pulses is compared with the average interpulse interval defined by the flywheel oscillator 84 output pulses. A pulse period counter 88 provides a means for measuring the width of a pulse output from the Schmitt trigger 86, and a printer 90 is utilized to display the output of the pulse period counter 88.

Figure 3:
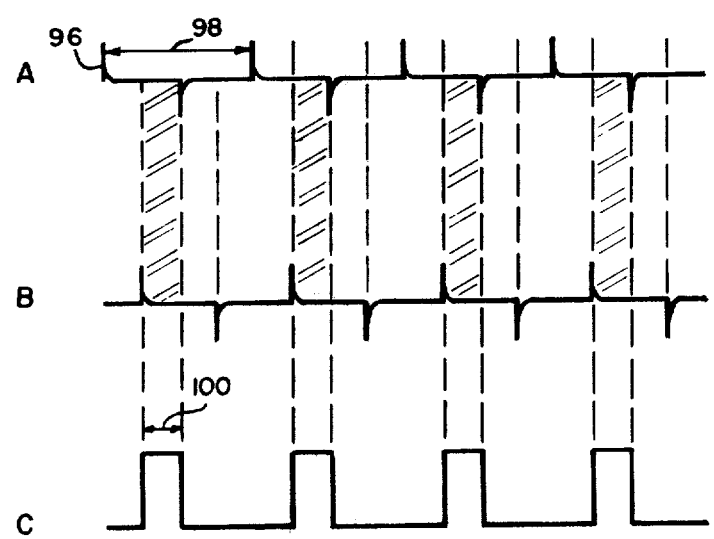
FIG. 3 are waveform diagrams of various points in the block diagram of FIG. 2.

Operation of the Faraday rotation calculator 76 can best be understood by referring to the waveform diagrams of FIG. 3 in conjunction with the block diagram of FIG. 2. Referring now to FIG. 3, waveform A is the output of the flywheel oscillator 84 and consists of a plurality of positive and negative going pulses 96, each pulse corresponding to the time at which the output of the first low pass filter 64 crosses zero. Since waveform A comprises the output of the flywheel oscillator 84, the interpulse time interval defined at 98 corresponds to the time required for the spacecraft to make one revolution. Waveform B corresponds to the output of the second zero-crossing detector 82 and is nominally shifted by 90 degrees with respect to waveform A as previously explained. However, also as previously explained, waveform B has superimposed upon it the Faraday rotation of the received signal. The Schmitt trigger 86 is chosen so that its output as shown at waveform C is set by positive pulses appearing on waveform B, and reset by negative pulses appearing on waveform A. Thus the output pulses from the Schmitt trigger 86 have a width which is partially determined by the amount of Faraday rotation present on the received signal. As can be readily appreciated, if no Faraday rotation were present then the width of the pulse shown in waveform C at 100 would be equal to one-quarter of the total interpulse time interval 98 defined by the positive output pulses from the flywheel oscillator 84. However, due to the Faraday rotation, the width 100 of the pulses from the Schmitt trigger 86 will cycle about this value depending on the amount of Faraday rotation present. Thus the width 100 of pulses from the Schmitt trigger 86 provides a direct indication of Faraday rotation.

It should be readily appreciated by those familiar with the electronic processing art that other circuitry could be utilized to measure a phase relationship between an averaged signal and one having instantaneous changes. In addition, the flywheel oscillator 84 could be connected to either one of the zero-crossing detectors 80 or 82, and the 90 degree phase shifter 72 could be inserted in front of the second phase detector 66 rather than the first phase detector 62.

Thus, it should now be apparent in a receiving system array that accomodates rotating linear polarization without incurring a 3 db mismatch loss in its circularly polarized receiving antenna, that a means has been disclosed which allows direct measurement of Faraday rotation for sign and range corrections, the Faraday rotation measurement being isolated from polarization shifts caused a spin stabilized spacecraft.

We claim:

1. In an rf receiver array having at least a first and second receiving system, said first receiving system having a reference signal for forming an IF signal and said second receiving system having a tracking feedback signal whose phase is related to the phase of a received signal, a measurement means for determining Faraday rotation of said received signal comprising:

a first phase detector;

a second phase detector;

means for providing said reference signal to said first phase detector;

means for providing said reference signal phase-shifted by a predetermined phase increment to said second phase detector;

means for providing said feedback signal to said first and second phase detectors;

first means for generating a plurality of first occurrence time signals when said first phase detector output defines a predetermined phase relationship between said reference signal and said feedback signal;

second means for generating a plurality of second occurrence time signals when said second phase detector output defines said predetermined phase relationship between said phase-shifted reference signal and said feedback signal;

third means for generating a plurality of cyclically occurring comparison signals having a cycle time related to an average time between a predetermined number of occurrence time signals from said first phase detector output signal;

and means for determining the phase relationship between said cyclically occuring comparison signals and said second occurrence time signals, said phase relationship being related to Faraday rotation of said received signal.

2. The measurement means of claim 1 wherein said rf receiving array includes an antenna having an orthomode transducer for providing a left circularly polarized signal to one of said receiving systems and a right circularly polarized signal to the other of said receiving systems, said receiving array being of the type wherein one receiving system is operated with a carrier tracking loop to provide a first oscillator frequency for the first and all other receiving systems arrayed, individual tracking loops in all other systems being operated at an IF for tracking out any phase differences due to separate group delays, the IF outputs of all systems being summed into said first system carrier tracking loop, said means for providing said phase shifted reference signal comprising a 90 degree phase shifter having said reference signal as an input and said phase-shifted reference signal as an output.

3. The measurement means of claim 2 wherein said first means for generating comprises a first zero-crossing detector which provides an output pulse whenever the output signal from said first phase detector passes through zero, each output pulse comprising one of said first occurrence time signals.

4. The measurement means of claim 3 wherein said second means for generating comprises a second zero-crossing detector which provides an output pulse whenever the output signal from said second phase detector passes through zero each of said output pulses comprising one of said second occurrence time signals.

5. The measurement means of claim 4 wherein said first and second zero-crossing detectors are chosen to be of the type that provide a pulse of one polarity when an input signal is increasing as it passes through zero, and a pulse of an opposite polarity when an input signal is decreasing as it passes through zero, said third means for generating comprises a flywheel oscillator means for generating a plurality of output pulses having a repetition rate equal to an average repetition rate of pulses from one of said first or second zero-crossing detectors.

6. The measurement means of claim 5 wherein said means for determining comprises means for generating a plurality of measurement pulses having a start time defined by output pulses from said second zero-crossing detector and an end time defined by output pulses from said flywheel oscillator means, the duration of each measurement pulse being related to the Faraday rotation of said received signal.

7. The measurement means of claim 6 wherein said means for generating a plurality of measurement pulses comprises a Schmitt trigger wherein its output pulse start time is defined by a positive pulse from said second zero-crossing detector and its output pulse end time is defined by a negative pulse from said flywheel oscillator means.

8. The measurement means of claim 7 further comprising:
 a pulse period counter for measuring the time duration of said Schmitt trigger output pulse; and
 a display means responsive to said pulse period counter.

9. In a system for diversity polarization reception from a single antenna having first and second arrayed receiving systems, one system for horizontal or left circular polarized reception and one for vertical or right circular polarized reception, said first receiving system operating with a carrier tracking loop having an IF signal and said second receiving system operating with a tracking loop having an IF signal, both IF signals being summed in said first system to obtain signal-to-noise ratios in both receivers that are effectively the same as that for matched polarization, a measurement means for determining Faraday rotation of a received signal comprising:
 first means for measuring phase differences between a reference signal for said carrier tracking loop and said second receiving system IF signal;
 second means for measuring phase differences between said reference signal for said carrier tracking loop after having been shifted 90 degrees in phase and said second receiving system IF signal;
 third means responsive to said first means for developing an average phase difference signal; and
 fourth means responsive to said second means and said third means for determining phase changes between said average phase difference signal and said phase differences measured by said second means, said phase changes being related to Faraday rotation of the received signal.

10. The measurement means of claim 9 wherein said first means comprises:
 a first phase detector having said reference signal and said second receiving system IF signal as inputs;
 a first zero-crossing detector providing first output pulses of one polarity when said first phase detector output signal increases through zero and second output pulses of another polarity when said first phase detector output signal decreases through zero; and
 said second means comprises;
 a second phase detector having said reference signal shifted 90 degrees in phase and said second receiving system IF signal as inputs; and
 a second zero-crossing detector providing third output pulses of one polarity when said second phase detector output signal increases through zero and fourth output pulses of another polarity when said second phase detector output signal decreases through zero.

11. The measurement means of claim 10 wherein said third means comprises means for generating a plurality of output pulses corresponding to said first zero-detector output pulses except that their repetition rate is adjusted to reflect an averaged repetition rate of said first zero-detector output pulses.

12. The measurement means of claim 11 wherein said means for generating comprises a flywheel oscillator.

13. The measurement means of claim 11 wherein fourth means comprises a Schmitt trigger having its output set by said comparison pulses of one polarity and reset by pulses of another polarity from said second zero-crossing detector, the set time duration of said Schmitt trigger output being related to Faraday rotation of said received signal.

14. The measurement means of claim 13 further comprising:
 a timing means for measuring the set time of said said Schmitt trigger; and
 display means responsive to said timing means.

15. In a system for diversity polarization reception from a single antenna having first and second receiving systems, one system for horizontal or left circular polarized reception and one system for vertical or right circular polarized reception, said first receiving system operating with a carrier tracking loop having an IF signal and said second receiving system operating with a tracking loop having an IF signal, both IF signals being summed in said first system for signal-to-noise ratios in both receivers that are effectively the same as that for matched polarization, a method for measuring Faraday rotation of a received signal comprising the steps of:
 determining the phase differences between a reference signal for said carrier tracking loop and said second receiving system IF signal;
 measuring phase differences between said reference signal for said carrier tracking loop after having been shifted 90 degrees in phase and said second receiving system IF signal;
 developing an average phase difference signal from the phase difference signals obtained from said determining step; and
 comparing said average phase difference signal from said developing step and instantaneous phase differences from said measuring step, the results of said comparing step being related to Faraday rotation of the received signal.

* * * * *